(12) United States Patent
Sagawa

(10) Patent No.: US 10,644,052 B2
(45) Date of Patent: *May 5, 2020

(54) DISPLAY DEVICE WITH SEPARATION MEMBER INCLUDING STEPS

(71) Applicant: Sony Corporation, Tokyo (JP)

(72) Inventor: Hiroshi Sagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/272,764

(22) Filed: Feb. 11, 2019

(65) Prior Publication Data

US 2019/0172859 A1 Jun. 6, 2019

Related U.S. Application Data

(60) Continuation of application No. 15/803,512, filed on Nov. 3, 2017, now Pat. No. 10,236,316, which is a
(Continued)

(30) Foreign Application Priority Data

Aug. 17, 2010 (JP) .................................. 2010-182470

(51) Int. Cl.
*H01L 33/00* (2010.01)
*H01L 21/00* (2006.01)
(Continued)

(52) U.S. Cl.
CPC ........ *H01L 27/1463* (2013.01); *H01L 27/156* (2013.01); *H01L 27/3211* (2013.01);
(Continued)

(58) Field of Classification Search
CPC ............. H01L 27/3246; H01L 27/3244; H01L 27/3276; H01L 51/5012; H01L 51/5206;
(Continued)

(56) References Cited

U.S. PATENT DOCUMENTS 7,547,920 B2 6/2009 Lee et al.
8,399,892 B2 3/2013 Sagawa
(Continued)

FOREIGN PATENT DOCUMENTS

CN 1444427 A 9/2003
CN 1472994 A 4/2004
(Continued)

OTHER PUBLICATIONS

US 9,812,520 B2, 11/2017, Sagawa (withdrawn)
(Continued)

*Primary Examiner* — Alonzo Chambliss
(74) *Attorney, Agent, or Firm* — Wolf, GreenField & Sacks, P.C.

(57) ABSTRACT

A display device includes: a substrate; a plurality of light-emission elements arranged, on the substrate, in a first direction and a second direction intersecting each other, each of the light-emission elements having a first electrode layer, an organic layer including a luminous layer, and a second electrode layer which are laminated in that order; and a separation section disposed, on the substrate, between the light-emission elements adjacent to each other in the first direction, the separation section having two or more pairs of steps. The first electrode layers in the light-emission elements are separated from each other, and the organic layers as well as the second electrode layers in the light-emission elements adjacent to each other in the first direction are separated from each other by the steps included in the separation section.

7 Claims, 14 Drawing Sheets

Related U.S. Application Data continuation of application No. 15/584,398, filed on May 2, 2017, now Pat. No. 10,026,766, which is a continuation of application No. 15/390,041, filed on Dec. 23, 2016, now Pat. No. 9,985,079, which is a continuation of application No. 15/095,272, filed on Apr. 11, 2016, now Pat. No. 9,564,475, which is a continuation of application No. 14/579,088, filed on Dec. 22, 2014, now Pat. No. 9,312,318, which is a continuation of application No. 14/302,345, filed on Jun. 11, 2014, now Pat. No. 8,956,899, which is a division of application No. 13/206,762, filed on Aug. 10, 2011, now Pat. No. 8,772,797.

(51) Int. Cl.

| | | |
|---|---|---|
| *H01L 27/146* | (2006.01) | |
| *H01L 33/60* | (2010.01) | |
| *H01L 33/50* | (2010.01) | |
| *H01L 33/36* | (2010.01) | |
| *H01L 33/08* | (2010.01) | |
| *H01L 27/32* | (2006.01) | |
| *H01L 27/15* | (2006.01) | |
| *H01L 33/44* | (2010.01) | |
| *H01L 51/52* | (2006.01) | |
| *H01L 51/50* | (2006.01) | |
| *H01L 51/56* | (2006.01) | |
| *H01L 31/0232* | (2014.01) | |
| *H01L 25/075* | (2006.01) | |

(52) U.S. Cl.
CPC ...... *H01L 27/3216* (2013.01); *H01L 27/3246* (2013.01); *H01L 27/3258* (2013.01); *H01L 27/3276* (2013.01); *H01L 33/08* (2013.01); *H01L 33/36* (2013.01); *H01L 33/44* (2013.01); *H01L 33/502* (2013.01); *H01L 33/505* (2013.01); *H01L 33/60* (2013.01); *H01L 51/5012* (2013.01); *H01L 51/5206* (2013.01); *H01L 51/5228* (2013.01); *H01L 51/56* (2013.01); *H01L 25/0753* (2013.01); *H01L 25/0756* (2013.01); *H01L 27/3248* (2013.01); *H01L 31/02327* (2013.01); *H01L 51/5036* (2013.01); *H01L 2227/323* (2013.01); *H01L 2924/0002* (2013.01)

(58) Field of Classification Search
CPC .. H01L 51/5228; H01L 51/56; H01L 25/0756
See application file for complete search history.

(56) References Cited

U.S. PATENT DOCUMENTS

| | | |
|---|---|---|
| 8,772,797 B2 | 7/2014 | Sagawa |
| 8,956,899 B2 | 2/2015 | Sagawa |
| 9,312,318 B2 | 4/2016 | Sagawa |
| 9,564,475 B2 | 2/2017 | Sagawa |
| 9,985,079 B2 | 5/2018 | Sagawa |
| 10,026,766 B2 | 7/2018 | Sagawa |
| 10,236,316 B2 * | 3/2019 | Sagawa .............. H01L 27/3211 |
| 2005/0253508 A1 | 11/2005 | Okano |
| 2005/0282304 A1 | 12/2005 | Inoue et al. |
| 2007/0228943 A1 | 10/2007 | Yamada et al. |
| 2008/0283836 A1 | 11/2008 | Lee et al. |
| 2010/0033089 A1 | 2/2010 | Nakamura et al. |
| 2012/0043565 A1 | 2/2012 | Sagawa |
| 2013/0099222 A1 | 4/2013 | Sagawa et al. |
| 2013/0100104 A1 | 4/2013 | Sagawa et al. |
| 2013/0187139 A1 | 7/2013 | Sagawa |
| 2014/0357004 A1 | 12/2014 | Sagawa |
| 2015/0137107 A1 | 5/2015 | Sagawa |
| 2016/0225835 A1 | 8/2016 | Sagawa |
| 2017/0110524 A1 | 4/2017 | Sagawa |
| 2017/0236853 A1 | 8/2017 | Sagawa |
| 2018/0061874 A1 | 3/2018 | Sagawa |

FOREIGN PATENT DOCUMENTS

| | | |
|---|---|---|
| CN | 1773718 A | 5/2006 |
| CN | 101097945 A | 1/2008 |
| CN | 101650917 A | 2/2010 |
| CN | 102332535 A | 1/2012 |
| EP | 2 169 738 A2 | 3/2010 |
| JP | 2005-322564 A | 11/2005 |
| JP | 2009-230990 A | 10/2009 |
| JP | 2009-259475 A | 11/2009 |
| JP | 2010-044894 A | 2/2010 |
| WO | WO 01/39554 A1 | 5/2001 |

OTHER PUBLICATIONS

Chinese Office Action dated Jan. 27, 2015 in connection with Chinese Application No. 2011-10235515.6, and English translation thereof.

Chinese Office Action dated Feb. 24, 2018 in connection with Chinese Application No. 201610094108.0 and English translation thereof.

\* cited by examiner

- ▨ METAL LAYER OF 1ST TIER
- ☐ METAL LAYER OF 2ND TIER
- ▨ CONNECTION SECTION CONNECTING METAL LAYER OF 1ST TIER AND METAL LAYER OF 2ND TIER
- ▨ CONNECTION SECTION CONNECTING METAL LAYER OF 2ND TIER AND 1ST ELECTRODE LAYER

DISPLAY DEVICE WITH SEPARATION MEMBER INCLUDING STEPS

RELATED APPLICATIONS

This application is continuation of and claims the benefit under 35 U.S.C. § 120 of U.S. patent application Ser. No. 15/803,512, titled "DISPLAY DEVICE WITH SEPARATION MEMBER INCLUDING STEPS," filed on Nov. 3, 2017, which is continuation of and claims the benefit under 35 U.S.C. § 120 of U.S. patent application Ser. No. 15/584,398, titled "DISPLAY DEVICE WITH SEPARATION MEMBER INCLUDING STEPS," filed on May 2, 2017, which is a continuation of and claims the benefit under 35 U.S.C. § 120 of U.S. patent application Ser. No. 15/390,041, titled "DISPLAY DEVICE WITH SEPARATION MEMBER INCLUDING STEPS," filed on Dec. 23, 2016, which is continuation of and claims the benefit under 35 U.S.C. § 120 of U.S. patent application Ser. No. 15/095,272, titled "DISPLAY DEVICE WITH SEPARATION MEMBER INCLUDING STEPS," filed on Apr. 11, 2016, now U.S. Pat. No. 9,564,475, which is continuation of and claims the benefit under 35 U.S.C. § 120 of U.S. patent application Ser. No. 14/579,088 titled "DISPLAY DEVICE WITH SEPARATION MEMBER INCLUDING STEPS," filed on Dec. 22, 2014, now U.S. Pat. No. 9,312,318, which claims the benefit under 35 U.S.C. § 120 of U.S. patent application Ser. No. 14/302,345 titled "METHOD OF FABRICATING A DISPLAY DEVICE WITH STEP CONFIGURATION IN THE INSULATING LAYER," filed on Jun. 11, 2014, now U.S. Pat. No. 8,956,899, which claims the benefit under 35 U.S.C. § 120 as a divisional application of U.S. patent application Ser. No. 13/206,762, titled "DISPLAY DEVICE WITH STEP CONFIGURATION IN THE INSULATING LAYER," filed Aug. 10, 2011, now U.S. Pat. No. 8,772,797, which claims priority to Japanese Patent Application No. 2010-182470, filed in the Japan Patent Office on Aug. 17, 2010, the entire contents of each of which are incorporated herein by reference.

BACKGROUND

The present disclosure relates to a display device having a self-luminous light-emission element including an organic layer and a method of producing the display device.

In recent years, as a display device substituting for a liquid crystal display, an organic EL (electroluminescence) display using a self-luminous organic light-emission element including an organic layer has been made practical. The organic EL display is of self-luminous type and thus has a wide viewing angle compared to a liquid crystal and the like, as well as having sufficient responsiveness to a high-definition high-speed image signal.

For the organic light-emission element, so far, an attempt has been made to improve display performance by introducing a resonator structure, and controlling light produced in a luminous layer, like improving a color purity of a luminous color or increasing luminous efficiency (for example, see International Publication No. WO01/39554). For instance, in a top-emission system in which light is extracted from a surface (top surface) opposite to a substrate, there is adopted a structure in which an anode electrode, an organic layer, and a cathode electrode are laminated sequentially via a drive transistor on a substrate; and multi-path reflection of light from the organic layer is caused between the anode electrode and the cathode electrode.

In an ordinary organic EL display, for example, an organic light-emission element that emits red light, an organic light-emission element that emits green light, and an organic light-emission element that emits blue light are arranged sequentially and repeatedly in an image display region. Those luminous colors vary depending on a material forming an organic layer of each color. Therefore, it is desirable to form the organic layers individually for the respective luminous colors, when forming each organic light-emission element. It is to be noted that in an ordinary organic EL display, an anode electrode and an organic layer are divided for every organic light-emission element, whereas a cathode electrode is one-piece to be shared by two or more (preferably, all) organic light-emission elements. Here, the organic layers in the respective organic light-emission elements adjacent to each other are separated from each other by an insulating layer. This insulating layer has an opening to define an emission region in each organic light-emission element.

Formation of the organic layer is performed, for example, by vapor deposition. At the time, the deposition is performed using a shadow mask having an opening according to an emission region and thus, it is desirable to align the opening of the insulating layer defining the emission region precisely with the opening of the shadow mask. Recently however, there has been a trend to narrow the width of the insulating layer and reduce the interval between the adjacent organic light-emission elements, in order to improve the ratio of the emission region of all the organic light-emission elements to the entire image display region, namely, a numerical aperture. For this reason, it is expected in future that if the above-mentioned interval is further reduced, it will be difficult to fill each emission region with a predetermined organic layer sufficiently with reliability. This is because there is such a concern that it might be difficult to ensure sufficient accuracy of alignment between the opening of the insulating layer and the opening of the shadow mask, or sufficiently ensure processing accuracy of the shadow mask itself, or the like. When the opening of the insulating layer is not filled with the organic layer sufficiently with reliability due to such a production error, desired luminance at a predetermined position in the image display region is not obtained, and it is difficult to perform correct image display corresponding to an inputted image signal.

To address such a disadvantage, for example, it is conceivable to employ a method of making the opening of the shadow mask larger than the opening of the insulating layer, and forming an organic layer greatly extending off the emission region to the insulating layer. This makes it possible to fill each emission region with a predetermined organic layer reliably.

In this case however, ends of the organic layers of organic light-emission elements adjacent to each other are in a condition of overlapping each other. Therefore, there is a possibility that a hole injection layer in one organic layer overlaying the end of the other organic layer may touch a cathode electrode covering those organic layers. In such a case, a conduction path is formed between an anode electrode and the cathode electrode via the hole injection layer, and a leakage current flows. Therefore, there is a possibility that control of driving each organic light-emission element may not be performed sufficiently, and normal image display in an organic EL display may be disturbed. In particular, when a leakage current flows between organic light-emission elements that emit light of different colors, this may cause a color mixture in the display image.

Therefore, the present applicant has already proposed a method of providing a separation film having a wall surface shaped like an overhang to surround each light-emission element, and separating organic layers as well as cathode electrodes in the adjacent light-emission elements from each other (for example, see Japanese Unexamined Patent Application Publication No. 2010-44894).

SUMMARY

However, it is expected that a further increase in the numerical aperture will be demanded in future. Therefore, there is desired a display device that may reliably prevent a leakage current from occurring even in such a case.

In view of the foregoing, it is desirable to provide a display device suitable for increase in a numerical aperture and allowed to exhibit better display performance, and a method of producing the display device.

According to an embodiment of the present disclosure, there is provided a display device including: a substrate; a plurality of light-emission elements arranged, on the substrate in a first direction and a second direction intersecting each other, each of the light-emission elements having a first electrode layer, an organic layer including a luminous layer, and a second electrode layer which are laminated in that order; and a separation section disposed, on the substrate, between the light-emission elements adjacent to each other in the first direction, the separation section having two or more pairs of steps. The first electrode layers in the light-emission elements are separated from each other, and the organic layers as well as the second electrode layers in the light-emission elements adjacent to each other in the first direction are separated from each other by the steps included in the separation section. Here, it is preferable that, for example, the light-emission elements emitting light of colors equal to each other be aligned in the second direction, and the light-emission elements emitting light of different colors be aligned in the first direction.

According to another embodiment of the present disclosure, there is provided a method of producing a display device having: a substrate; a plurality of light-emission elements arranged, on the substrate, in a first direction and a second direction intersecting each other, each of the light-emission elements having a first electrode layer, an organic layer including a luminous layer, and a second electrode layer which are laminated in that order; and a separation section disposed, on the substrate, between the light-emission elements adjacent to each other in the first direction, the separation section having two or more pairs of steps. The method includes the followings steps.
(A) Forming a plurality of first electrode layers on the substrate to be arranged away from each other.
(B) Forming an insulating layer filling a gap between the plurality of first electrode layers to form a separation section.
(C) Forming two or more pairs of steps in the insulating layer of the separation section.
(D) Forming a plurality of organic layers including a luminous layer sequentially to cover the entire of the first electrode layers and the insulating layer of the separation section.
(E) Forming a second electrode layer to cover the organic layers.

Here, at the time of forming the organic layer and the second electrode layer, the organic layers as well as the second electrode layers in the light-emission elements adjacent to each other in the first direction are separated from each other by the steps included in the separation section.

In the display device and the method of producing the display device according to the above-described embodiments of the present disclosure, the second electrode layers as well as the organic layers in the light-emission elements adjacent to each other in the first direction are separated from each other by the two or more pairs of steps included in the separation section. Therefore, leakage of a driving current between the light-emission elements adjacent to each other in the first direction is avoided. Here, in a case where the light-emission elements adjacent to each other in the first direction are elements emitting light of different colors, a color shift is prevented.

According to the display device and the method of producing the display device in the above-described embodiments of the present disclosure, the second electrode layers as well as the organic layers in the light-emission elements adjacent to each other in the first direction are separated from each other by the two or more pairs of steps included in the separation section. Therefore, it is possible to reliably prevent a short circuit between the first electrode layer and the second electrode layer and a short circuit between the first electrode layers adjacent to each other, even when an overlap between the organic layers occurs due to narrowing of a distance between the light-emission elements adjacent to each other in the first direction. For this reason, it is possible to perform control of driving each of the light-emission elements sufficiently, while supporting the narrowing of the distance between the light-emission elements. As a result, it is possible to exhibit high display performance such as excellence in uniformity of light-emission luminance distribution and color separability in an image display region, while securing a high numerical aperture.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION OF EMBODIMENTS

An embodiment of the present disclosure (hereinafter merely referred to as the embodiment) will be described below in detail with reference to the drawings.

Figure 1:
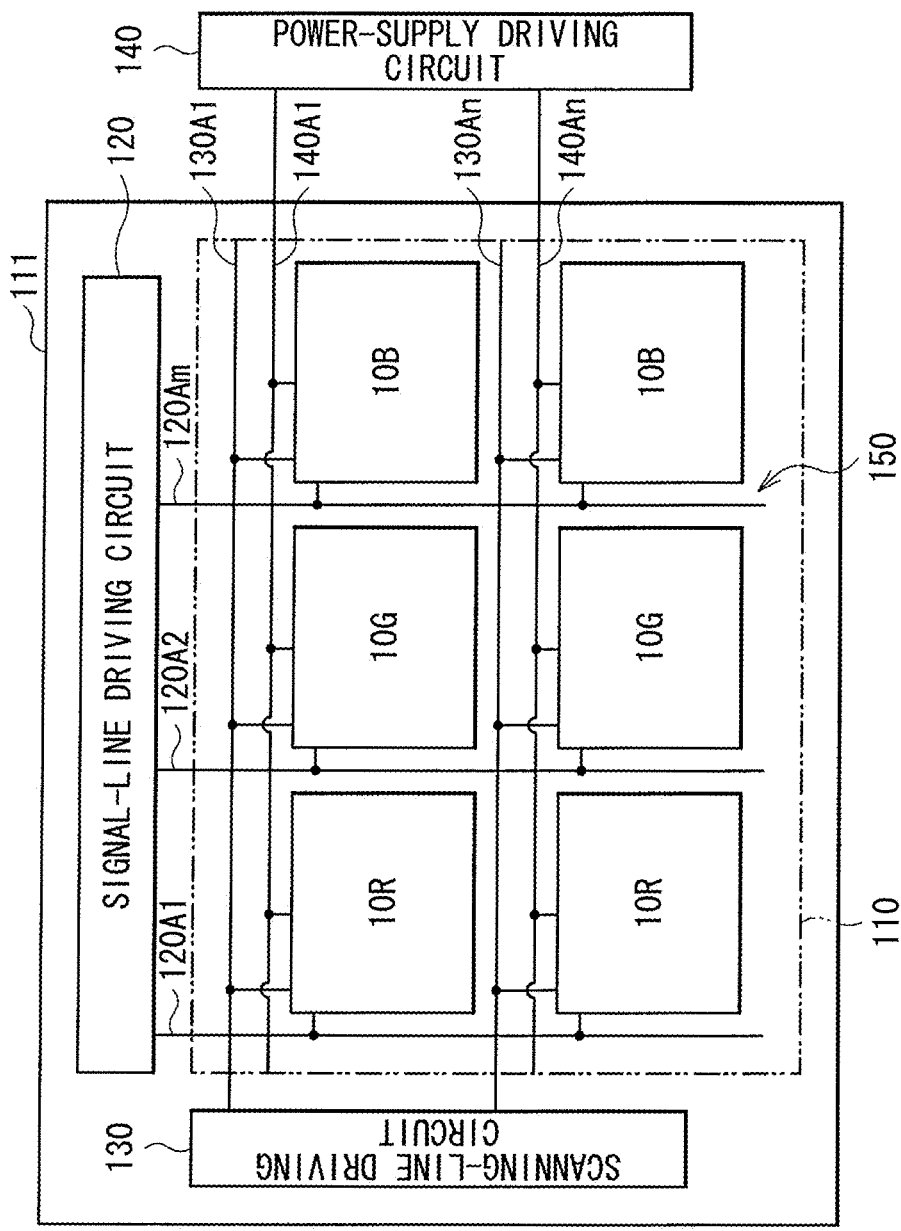
FIG. 1 is a diagram illustrating a configuration of a display device according to an embodiment of the present disclosure.

FIG. 1 illustrates a configuration of a display device using an organic light-emission element according to an embodiment in the present disclosure. This display device is used as an extra-thin organic light-emitting color display device or the like. In this display device, a display region 110 is formed on a board 111. Around the display region 110 on the board 111, a signal-line driving circuit 120 that is a driver for image display, a scanning-line driving circuit 130, and a power-supply-line driving circuit 140 are formed, for example.

Formed in the display region 110 are a plurality of organic light-emission elements 10 (10R, 10G, and 10B) two-dimensionally arranged in the form of a matrix, and a pixel driving circuit 150 for driving the organic light-emission elements. In the pixel driving circuit 150, a plurality of signal lines 120A (120A1, 120A2, . . . , 120Am, . . . ) are arranged in a column direction (Y-axis direction), and a plurality of scanning lines 130A (130A1, . . . , 130An, . . . ) and a plurality of power supply lines 140A (140A1, . . . , 140An, . . . ) are arranged in a row direction (X-axis direction). Any one of the organic light-emission elements 10R, 10G, and 10B is associated with and provided at an intersection between each of the signal lines 120A and each of the scanning lines 130A. Each of the signal lines 120A is connected to the signal-line driving circuit 120, each of the scanning lines 130A is connected to the scanning-line driving circuit 130, and each of the power supply lines 140A is connected to the power-supply-line driving circuit 140.

The signal-line driving circuit 120 supplies a signal voltage of an image signal supplied from a signal supply source (not illustrated) and corresponding to luminous information, to the organic light-emission elements 10R, 10G, and 10B selected via the signal line 120A.

The scanning-line driving circuit 130 is configured by using a shift register and the like, the shift register sequentially shifting (transferring) start pulses in synchronization with inputted clock pulses. The scanning-line driving circuit 130 scans each of the organic light-emission elements 10R, 10G, and 10B on a line-by-line basis at the time of writing an image signal to each of the organic light-emission elements 10R, 10G, and 10B, and supplies a scanning signal to each of the scanning lines 130A sequentially.

The power-supply-line driving circuit 140 is configured by using a shift register and the like, the shift register sequentially shifting (transferring) start pulses in synchronization with inputted clock pulses. The power-supply-line driving circuit 140 appropriately supplies either of a first electric potential and a second electric potential different from each other to each of the power supply lines 140A, in synchronization with the scanning on a line-by-line basis by the scanning-line driving circuit 130. This makes a selection of a conduction state or a non-conduction state of a drive transistor Tr1 to be described later.

Figure 2:
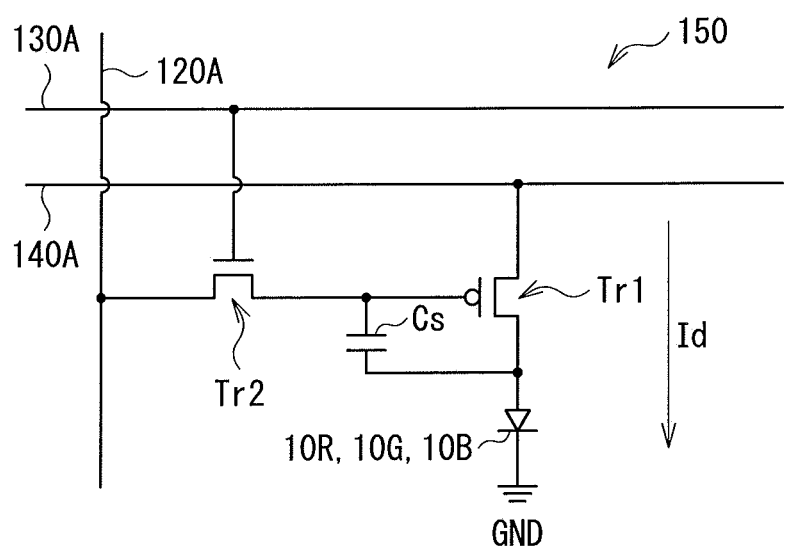
FIG. 2 is a diagram illustrating an example of a pixel driving circuit illustrated in FIG. 1.

The pixel driving circuit 150 is provided in a tier (a pixel-driving-circuit forming layer 112 to be described later) between the board 111 and the organic light-emission element 10. A configurational example of the pixel driving circuit 150 is illustrated in FIG. 2. As illustrated in FIG. 2, the pixel driving circuit 150 is an active driving circuit having the drive transistor Tr1 as well as a write transistor Tr2, a capacitor (retention capacitor) Cs provided between the transistors Tr1 and Tr2, and the organic light-emission element 10. The organic light-emission element 10 is connected to the drive transistor Tr1 in series between the power supply line 140A and a common power supply line (GND). Each of the drive transistor Tr1 and the write transistor Tr2 may be configured by using a general thin-film transistor (TFT), and its structure may be, for example, an inverted staggered structure (a so-called bottom gate type) or a staggered structure (a top gate type), and is not limited in particular.

The write transistor Tr2 has a drain electrode connected to the signal line 120A, for example, and is supplied with the image signal from the signal-line driving circuit 120. Further, the write transistor Tr2 has a gate electrode connected to the scanning line 130A, and is supplied with the scanning signal from the scanning-line driving circuit 130. Furthermore, the write transistor Tr2 has a source electrode connected to a gate electrode of the drive transistor Tr1.

The drive transistor Tr1 has a drain electrode connected to the power supply line 140A, for example, and the drain electrode is set to either the first electric potential or the second electric potential by the power-supply-line driving circuit 140. The drive transistor Tr1 has a source electrode connected to the organic light-emission element 10.

The retention capacitor Cs is formed between the gate electrode of the drive transistor Tr1 (the source electrode of the write transistor Tr2) and the source electrode of the drive transistor Tr1.

Figure 3:
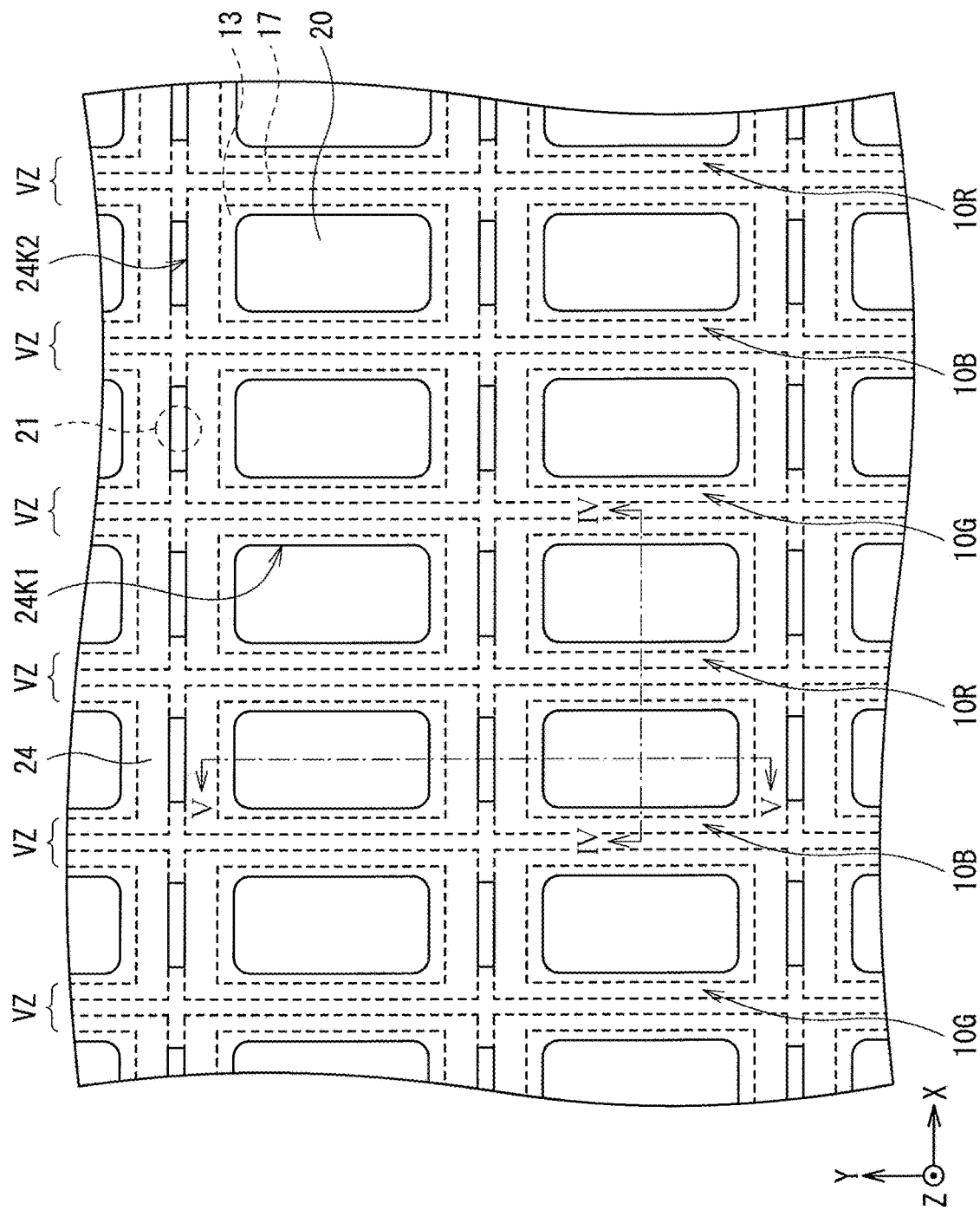
FIG. 3 is a plan view illustrating a configuration of a display region illustrated in FIG. 1.

FIG. 3 illustrates a configurational example of the display region 110 spreading on an XY plane. Here, there is illustrated a plane configuration when the display region 110 in a state of a second electrode layer 16, a protective film 18, and a sealing substrate 19 (each will be described later) being removed is viewed from above.

In the display region 110, the organic light-emission elements 10 are sequentially arranged in the form of a matrix as a whole. To be more specific, an element separating insulating layer 24 is provided in the form of a lattice, and the organic light-emission elements 10R, 10G, and 10B are each disposed at each region defined thereby. The organic light-emission elements 10R, 10G, and 10B each include an emission region 20 with an outline defined by an opening 24K1 of the element separating insulating layer 24. The organic light-emission element 10R emits red light, the organic light-emission element 10G emits green light, and the organic light-emission element 10B emits blue light. Here, the organic light-emission elements 10 emitting light of the same color are arranged in one line in the Y-axis direction, and this one line is repeated sequentially in the X-axis direction. Therefore, a combination of the organic light-emission elements 10R, 10G, and 10B adjacent in the X-axis direction forms a picture element (pixel).

In the element separating insulating layer 24, a metal layer 17 is embedded to surround each of the organic light-emission elements 10. The metal layer 17 has parts extending in the X-axis direction and parts extending in the Y-axis direction, which are integral to be in the form of a lattice. In addition, in FIG. 3, a rectangular broken line surrounding the emission region 20 indicates a first electrode layer 13 (to be described later) included in the organic light-emission element 10. In addition, the element separating insulating layer 24 is provided with a plurality of openings 24K2 each formed in a region between the organic light-emission elements 10 adjacent to each other in the Y-axis direction and overlapping the metal layer 17. In the region surrounded by this opening 24K2, a connection section 21 (a part surrounded by a broken line) to make connection between the metal layer 17 and the second electrode layer 16 of the organic light-emission element 10 is provided. It is to be noted that the number of the organic light-emission elements 10 arranged in the X direction and the Y direction is arbitrarily set, and is not limited to the number illustrated in FIG. 3. Moreover, one pixel may be formed of four or more organic light-emission elements, or an organic light-emission element that emits white light may be further provided.

Figure 4:
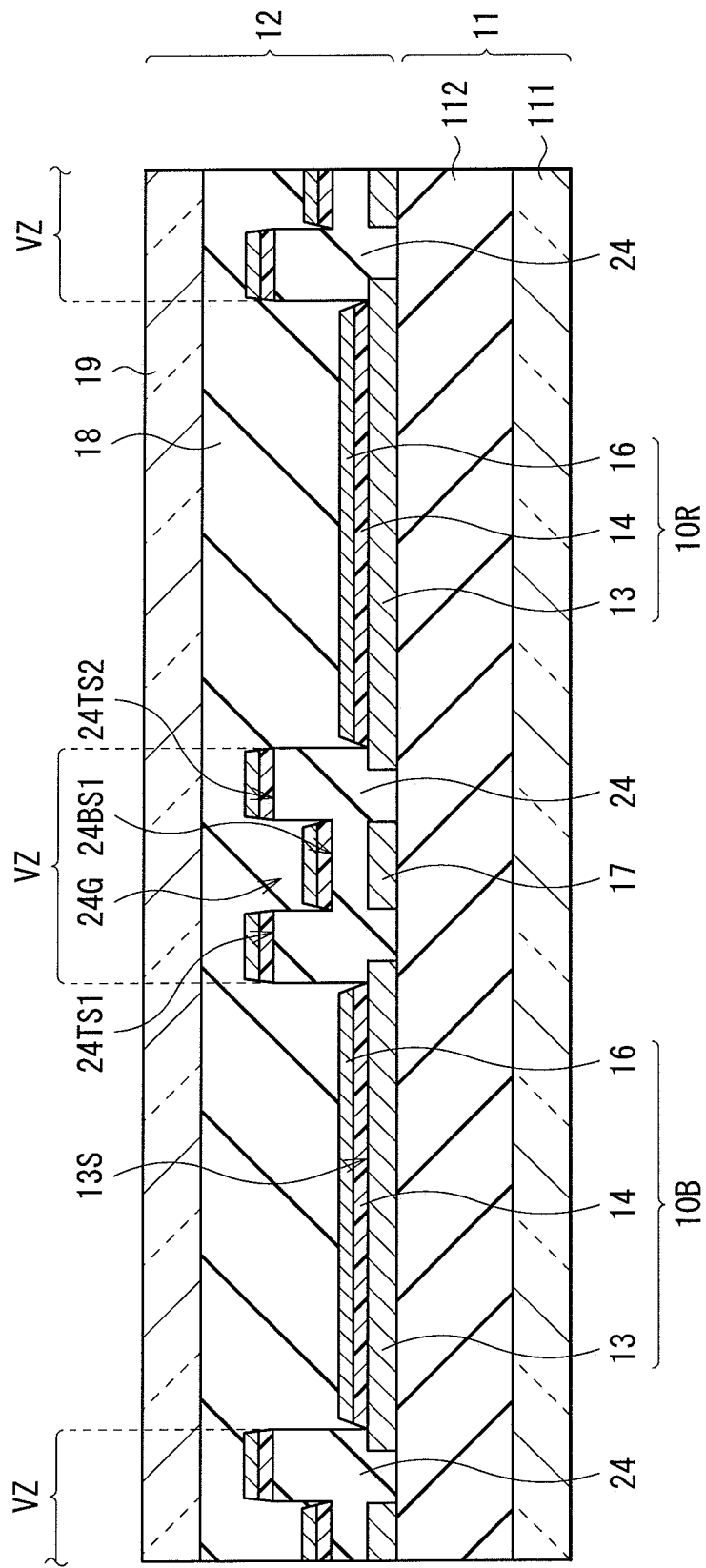
FIG. 4 is a cross-sectional diagram illustrating a configuration of the display region illustrated in FIG. 1.
Figure 5:
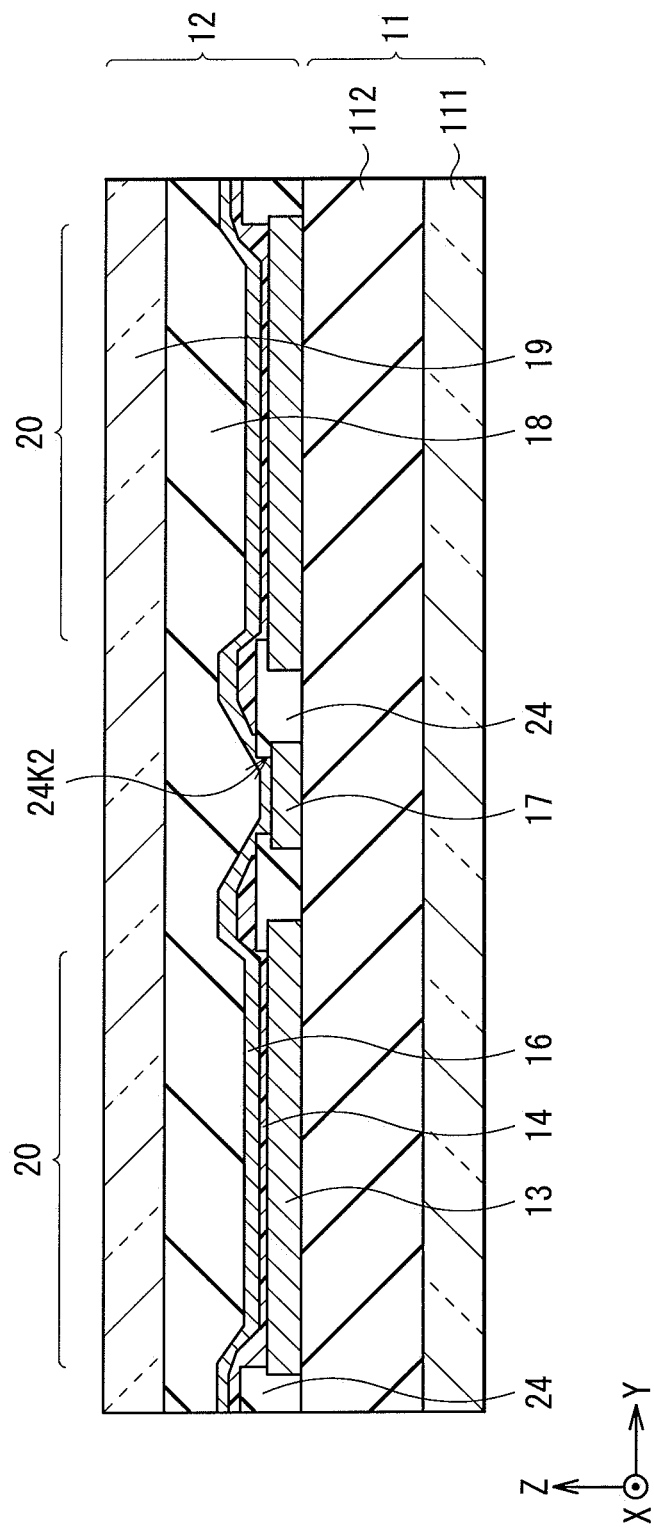
FIG. 5 is another cross-sectional diagram illustrating a configuration of the display region illustrated in FIG. 1.

FIG. 4 illustrates a schematic structure of an XZ section of the display region 110, taken along a line IV-IV illustrated in FIG. 3. Further, FIG. 5 illustrates a schematic structure of a YZ section of the display region 110, taken along a line V-V illustrated in FIG. 3. As illustrated in FIG. 4 and FIG. 5, in the display region 110, on a substrate 11 formed by providing the pixel-driving-circuit forming layer 112 on the board 111, a light-emission element forming layer 12 including the organic light-emission elements 10 is formed. On the organic light-emission elements 10, the protective film 18 and the sealing substrate 19 are sequentially formed to cover the whole. Each of the organic light-emission elements 10 is an element in which the first electrode layer 13 serving as an anode electrode, an organic layer 14 including a luminous layer 14C (to be described later), the second electrode layer 16 serving as a cathode electrode are laminated sequentially from the board 111 side. The organic layers 14 as well as the first electrode layers 13 are separated for every organic light-emission element 10 by the element separating insulating layer 24. Further, the second electrode layer 16 in each of the organic light-emission elements 10 is separated from the second electrode layer 16 in each of other organic light-emission elements 10 adjacent in the X-axis direction, due to existence of the insulating layer 24 located in a gap region VZ and serving as a separation section (see FIG. 4). It is to be noted that the gap region VZ is a region between the organic light-emission elements 10 adjacent to each other in the X-axis direction. On the other hand, the second electrode layers 16 in the respective organic light-emission elements 10 adjacent to each other in the Y-axis direction are combined with each other (see FIG. 5). It is to be noted that the metal layer 17 is embedded in the element separating insulating layer 24, except a region corresponding to the opening 24K2.

The element separating insulating layer 24 is provided to fill a gap between the first electrode layers 13 as well as the organic layers 14 in the respective organic light-emission elements 10 adjacent to each other. The element separating insulating layer 24 is made of an organic material, e.g., polyimide, and ensures insulation between the first electrode layer 13 and the second electrode layer 16 as well as the metal layer 17, while precisely defining the emission region 20 of the organic light-emission element 10.

Figure 6:
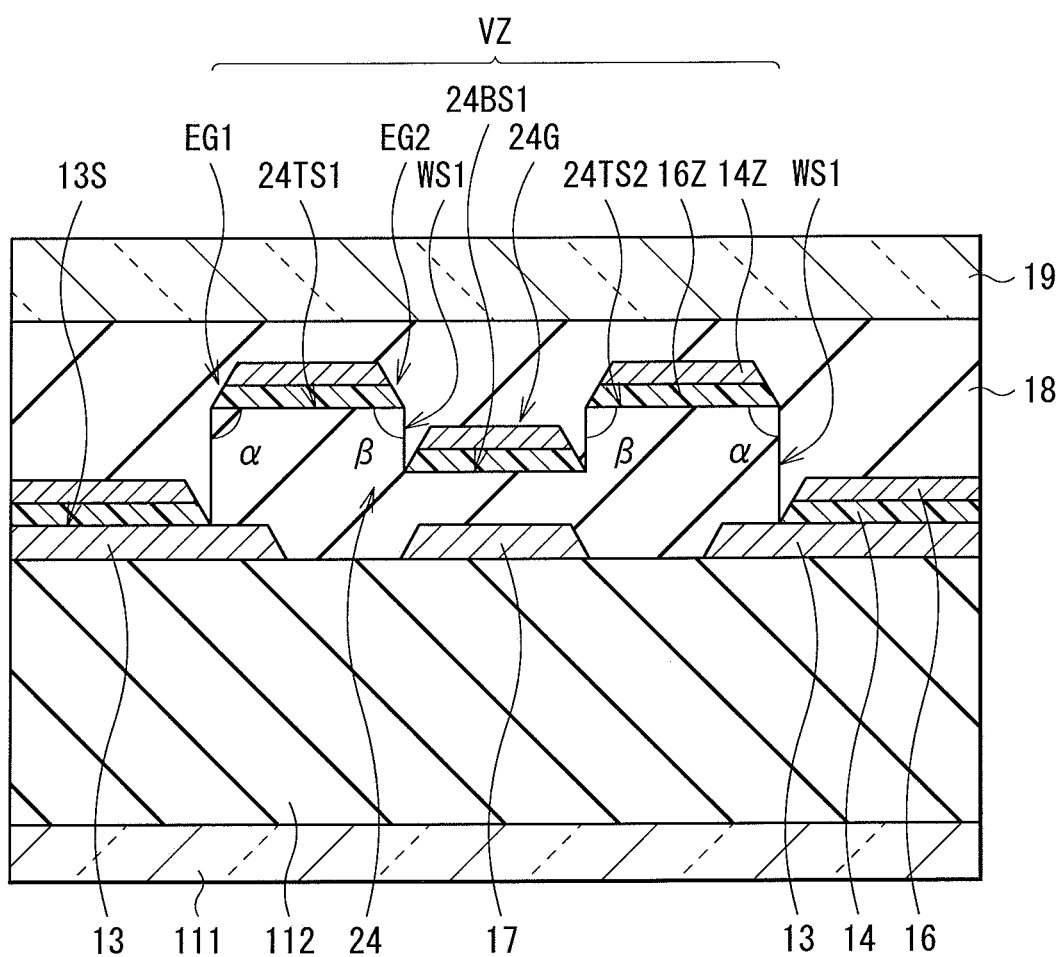
FIG. 6 is an enlarged cross-sectional diagram illustrating a configurational example of a concave section in an element separating insulating layer illustrated in FIG. 4.

In addition, the gap region VZ of the insulating layer 24 is provided with a concave section 24G, and thereby two pairs of steps are formed. FIG. 6 illustrates an enlarged view of a part near the concave section 24G illustrated in FIG. 4. The two pairs of steps here are; steps formed by a top surface 24TS1 and a bottom 24BS1, and steps formed by a top surface 24TS2 and the bottom 24BS1. In addition, it is desirable that in a thickness direction (Z-axis direction), a difference between the top surfaces 24TS1 and 24TS2 at the highest position of the element separating insulating layer 24, (the maximum height position in the element separating insulating layer 24) and the position of a surface 13S of the first electrode layer 13 be larger than the total thickness of the organic layer 14 and the second electrode layer 16.

Figure 7:
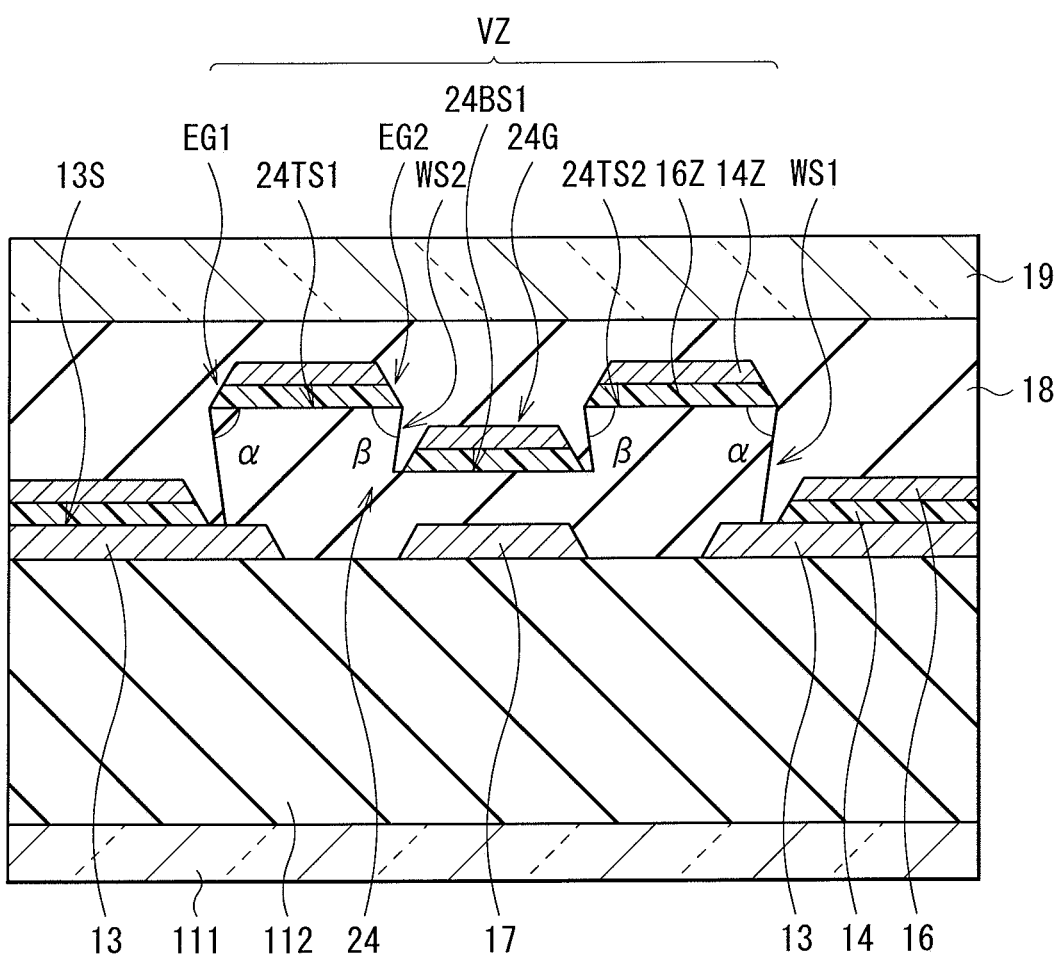
FIG. 7 is an enlarged cross-sectional diagram illustrating another configurational example of the concave section in the element separating insulating layer illustrated in FIG. 4.

In the concave section 24G, one or both of angles α and β formed by the top surfaces 24TS1 and 24TS2 and sidewalls WS1 and WS2 are 90 degrees or less (preferably, less than 90 degrees). Specifically, as illustrated in FIG. 6, for example, this is a part where portions on both sides of the concave section 24G each have a rectangular shape in cross section, or as in another configurational example illustrated in FIG. 7, a part where portions on both sides of the concave section 24G each have a reversed trapezoidal shape in cross section. Thanks to such a concave section 24G, even when materials forming the organic layer 14 and the second electrode layer 16 are deposited on the entire display region 110 at a time by, for example, vapor deposition, the organic layers 14 as well as the second electrode layer 16 in the respective organic light-emission elements 10 adjacent in the X-axis direction are reliably separated from each other. This is because the angles α and β at edges EG1 and EG2 are 90 degrees or less and thus, deposed materials do not easily accumulate in their neighborhood, resulting in a break between: the organic layer 14 as well as the second electrode layer 16 provided in the emission region 20; and an organic layer 14Z as well as a second electrode layer 16Z covering the top surfaces 24TS1 and 24TS2, and the bottom 24BS1, at each of the edges EG1 and EG2. In particular, when the portions on both sides of the concave section 24G each have the reversed trapezoidal shape in cross section as in FIG. 7, the organic layers 14 as well as the second electrode layers 16 are separated from each other more reliably.

The protective film 18 covering the organic light-emission element 10 is made of an insulating material such as silicon nitride (SiNx). Further, the sealing substrate 19 provided thereon seals the organic light-emission element 10 together with the protective film 18 and an adhesive layer (not illustrated), and is made of a material such as transparent glass which allows light produced in the luminous layer 14C to pass therethrough.

Next, with reference to FIG. 8 and FIG. 9 in addition to FIG. 4 to FIG. 6, there will be described a detailed configuration of each of the substrate 11 and the organic light-emission element 10. It is to be noted that the organic light-emission elements 10R, 10G, and 10B are partially different in terms of the configuration of the organic layer 14, but otherwise have the same configuration, and thus will be described collectively.

Figure 8:
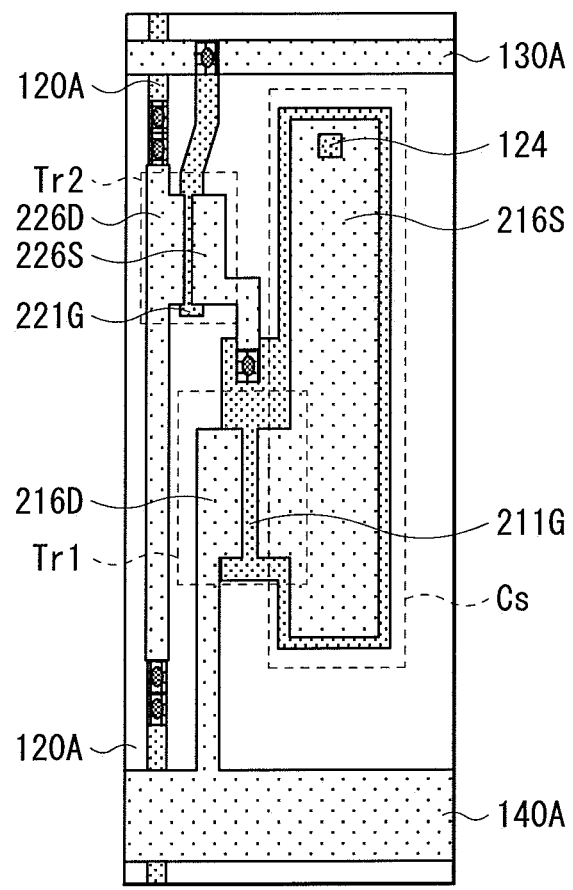
FIG. 8 is a plan view illustrating a configuration of a pixel-driving-circuit forming layer illustrated in FIG. 4.
Figure 9:
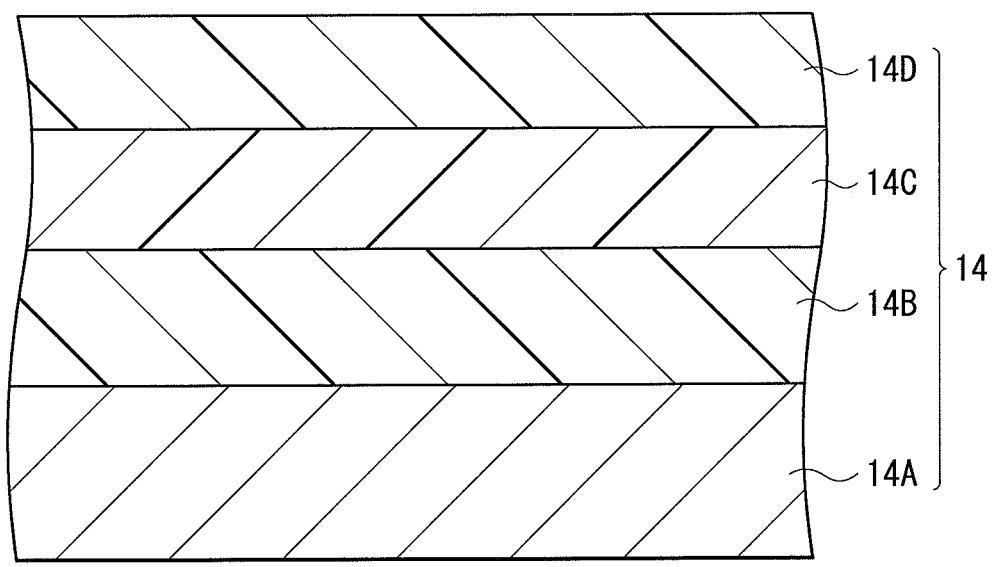
FIG. 9 is an enlarged cross-sectional diagram illustrating an organic layer illustrated in FIG. 4.

FIG. 8 is a schematic diagram illustrating a plane configuration of the pixel driving circuit 150 provided in the pixel-driving-circuit forming layer 112, in one of the organic light-emission elements 10.

The substrate 11 is an element where the pixel-driving-circuit forming layer 112 including the pixel driving circuit 150 is provided on the board 111 made of glass, silicon (Si) wafer, resin, or the like. On the surface of the board 111, a metal layer 211G that is the gate electrode of the drive transistor Tr1, a metal layer 221G that is the gate electrode of the write transistor Tr2, and a part of the signal line 120A are provided as metal layers of a first tier. These metal layers 211G and 221G and the signal line 120A are covered with a gate insulating film (not illustrated) made of silicon nitride, silicon oxide, or the like.

In the drive transistor Tr1, a part of the region on the gate insulating film, which part corresponds to the metal layer 211G, is provided with a channel layer (not illustrated) of a semiconductor thin film made of amorphous silicon or the like. On the channel layer, an insulating channel protective film (not illustrated) is provided to occupy a channel region that is a central region thereof, and a drain electrode (not illustrated) and a source electrode (not illustrated) each formed of an n-type semiconductor thin film made of n-type amorphous silicon or the like are provided in regions on both sides thereof. These drain electrode and source electrode are separated from each other by the channel protective film mentioned above, and their respective end faces are apart from each other across the channel region interposed in between. Further, a metal layer 216D serving as a drain wire and a metal layer 216S serving as a source wire are provided as metal layers of a second tier, so as to cover the drain electrode and the source electrode, respectively. The metal layer 216D and the metal layer 216S each have a structure in which, for example, a titanium (Ti) layer, an aluminum (Al) layer, and a titanium layer are laminated sequentially. The write transistor Tr2 has a configuration similar to that of the drive transistor Tr1. It is to be noted that in FIG. 8, the metal layer 221G serving as the metal layer of the first tier, a metal layer 226D (drain wire) and a metal layer 226S (source wire) serving as metal layers of the second tier are illustrated as components of the write transistor Tr2.

As the metal layers of the second tier, other than the metal layers 216D and 226D and the metal layers 216S and 226S mentioned above, the scanning line 130A and the power supply line 140A are provided. It is to be noted that, here, the drive transistor Tr1 and the write transistor Tr2 in the inverted staggered structure (so-called bottom gate type) have been described, but they may be in the staggered structure (so-called top gate type). Further, the signal line 120A is provided as a metal layer of the second tier, in a region except the intersection between the scanning line 130A and the power supply line 140A.

The pixel driving circuit 150 is covered as a whole by the protective film (not illustrated) made of silicon nitride or the like and further, an insulating flattening film (not illustrated) is provided thereon. It is desirable that the flattening film have a surface with extremely high surface smoothness. In addition, in part of the flattening film and the protective film, a minute connection hole 124 is provided (see FIG. 8). It is desirable that the flattening film be made of a material with high pattern precision such as an organic material of polyimide or the like. The connection hole 124 is filled with the first electrode layer 13, which establishes conduction with the metal layer 216S forming the source wire of the drive transistor Tr1.

The first electrode layer 13 is formed on the flattening film that is the uppermost layer of the pixel-driving-circuit forming layer 112, and also functions as a reflective layer. For this reason, it is desirable that the first electrode layer 13 be made of a material having a highest possible reflectance, in order to increase luminous efficiency. Specifically, the first electrode layer 13 is made of a high reflectance material such as aluminum (Al) or aluminum neodymium alloy (AlNd). It is to be noted that aluminum has low resistance to a developer used in a development process at the time of forming the openings 24K1 and 24K2 of the element separating insulating layer 24 and thus, easily corrodes. In contrast, AlNd has high resistance to a developer and does not easily corrode. Therefore, it is recommended that the first electrode layer 13 be a single-layer structure made of AlNd, or a two-layer structure including an aluminum layer and AlNd (Al layer (lower layer)/AlNd layer (upper layer)). In particular, in the case of the two-layer structure of the Al layer (lower layer)/the AlNd layer (upper layer), the resistance becomes low compared to the single-layer structure of the AlNd layer and thus, this case is desirable. The overall thickness of the first electrode layer 13 is, for example, 100 nm or more and 1,000 nm or less. Further, the first electrode layer 13 may have a two-layer structure, an upper layer thereof (a layer contacting the organic layer 14) may be made of the high reflectance material mentioned above, and a lower layer thereof (a layer contacting the flattening film of the pixel-driving-circuit forming layer 112) may be made of a low reflectance material such as molybdenum (Mo) or its compound (alloy). This is because thus providing the layer having a high light absorption rate on the surface contacting the pixel-driving-circuit forming layer 112 provided with the drive transistor Tr1 and the write transistor Tr2 makes it possible to absorb external light or unwanted light such as light leaking from the organic light-emission element 10. It is to be noted that the first electrode layer 13 is formed, as described above, to cover the surface of the flattening film, and fill the connection hole 124.

The organic layer 14 is formed over the entire surface of the emission region 20 defined by the element separating insulating layer 24 with no gap. The organic layer 14 has, as illustrated in FIG. 9, for example, a configuration in which a hole injection layer 14A, a hole transport layer 14B, the luminous layer 14C, and an electron transport layer 14D are laminated sequentially from the first electrode layer 13 side. However, the layers except the luminous layer 14C may be provided optionally. It is to be noted that FIG. 9 illustrates an enlarged part of a section of the organic layer 14 illustrated in FIG. 4 to FIG. 6.

The hole injection layer 14A is a buffer layer to increase hole injection efficiency, and prevent leakage. The hole transport layer 14B is intended to increase hole transport efficiency to the luminous layer 14C. The luminous layer 14C produces light with the application of an electric field, causing recombination between electron and positive hole. The electron transport layer 14D is intended to increase electron transport efficiency to the luminous layer 14C. It is to be noted that between the electron transport layer 14D and the second electrode layer 16, an electronic injection layer (not illustrated) made of LiF, $Li_2O$, or the like may be provided.

Further, the organic layers 14 vary in configuration, depending on the luminous colors of the organic light-emission elements 10R, 10G, and 10B. The hole injection layer 14A of the organic light-emission element 10R has, for example, a thickness of 5 nm or more and 300 nm or less, and is made of 4,4',4"-tris(3-methylphenylphenylamino)triphenylamine (m-MTDATA), or 4,4',4"-tris(2-naphthylphenylamino)triphenylamine (2-TNATA). The hole transport layer 14B of the organic light-emission element 10R has, for example, a thickness of 5 nm or more and 300 nm or less, and is made of bis[(N-naphthyl)-N-phenyl]benzidine (α-NPD). The luminous layer 14C of the organic light-emission element 10R has, for example, a thickness of 10 nm or more and 100 nm or less, and is made of 8-quinolinol aluminum complex ($Alq_3$) mixed with 40 vol % of 2,6-bis [4-[N-(4-methoxyphenyl)-N-phenyl]aminostyryl]naphthalene-1,5-dicarbonitrile (BSN-BCN). The electron transport layer 14D of the organic light-emission element 10R has, for example, a thickness of 5 nm or more and 300 nm or less, and is made of $Alq_3$.

The hole injection layer 14A of the organic light-emission element 10G has, for example, a thickness of 5 nm or more and 300 nm or less, and is made of m-MTDATA or 2-TNATA. The hole transport layer 14B of the organic light-emission element 10G has, for example, a thickness of 5 nm or more and 300 nm or less, and is made of α-NPD. The luminous layer 14C of the organic light-emission element 10G has, for example, a thickness of 10 nm or more and 300 nm or less, and is made of $Alq_3$ mixed with 3 vol % of Coumarin 6. The electron transport layer 14D of the organic light-emission element 10G has, for example, a thickness of 5 nm or more and 300 nm or less, and is made of $Alq_3$.

The hole injection layer 14A of the organic light-emission element 10B has, for example, a thickness of 5 nm or more and 300 nm or less, and is made of m-MTDATA or 2-TNATA. The hole transport layer 14B of the organic light-emission element 10B has, for example, a thickness of 5 nm or more and 300 nm or less, and is made of α-NPD. The luminous layer 14C of the organic light-emission element 10B has, for example, a thickness of 10 nm or more and 100 nm or less, and is made of spiro 61. The electron transport layer 14D of the organic light-emission element 10B has, for example, a thickness of 5 nm or more and 300 nm or less, and is made of $Alq_3$.

The second electrode layer 16 has, for example, a thickness of 5 nm or more and 50 nm or less, and is made of a simple substance or an alloy of a metallic element such as aluminum (Al), magnesium (Mg), calcium (Ca), or sodium (Na). Above all, an alloy of magnesium and silver (MgAg alloy), or an alloy of aluminum (Al) and lithium (Li) (AlLi alloy) is preferable. The second electrode layer 16 is, for example, provided commonly for all the organic light-emission elements 10R, 10G, and 10B, and disposed to face the first electrode layer 13 of each of the organic light-emission elements 10R, 10G, and 10B. Further, the second electrode layer 16 is formed to cover not only the organic layer 14 but the element separating insulating layer 24 as well.

Figure 10:
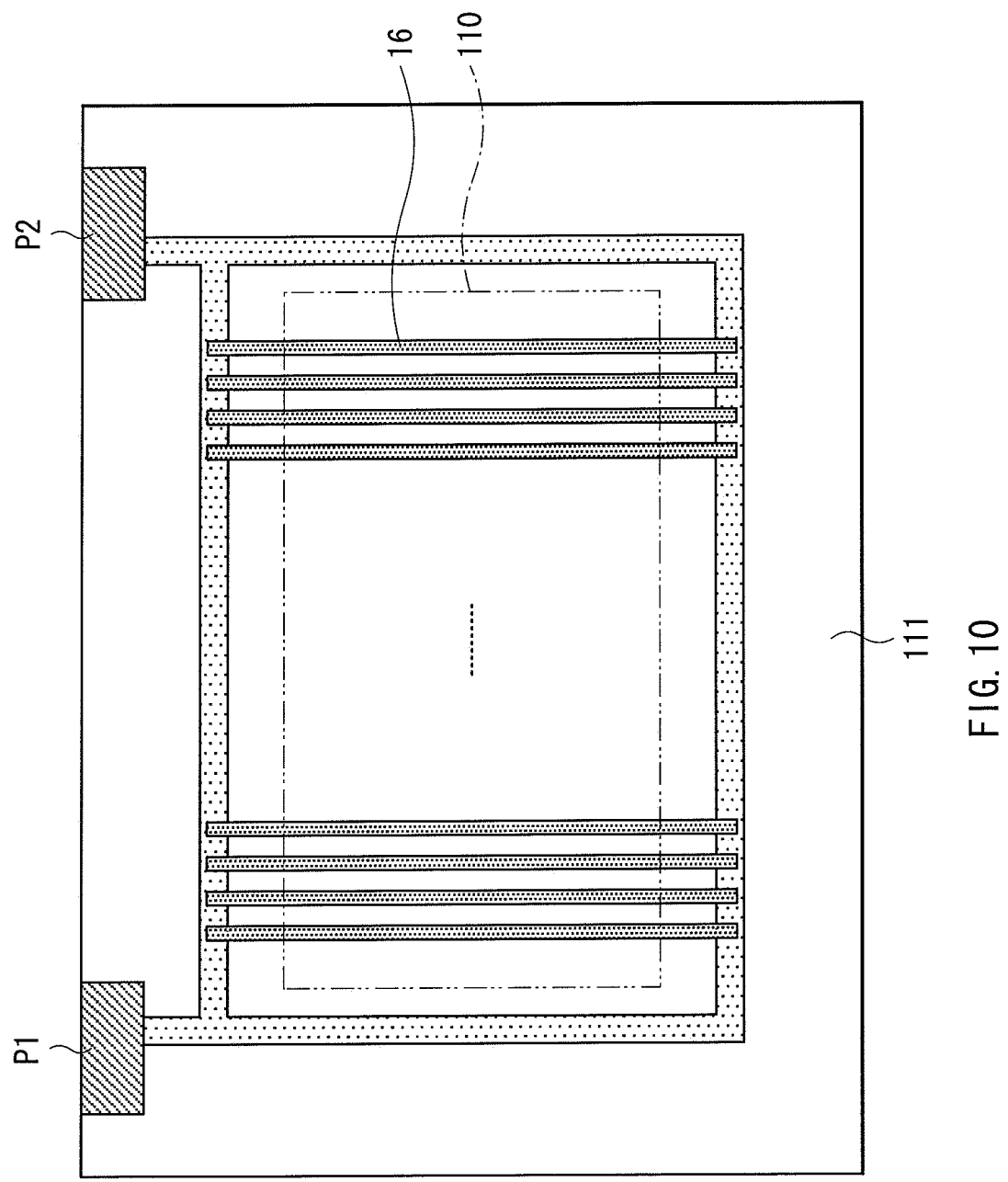
FIG. 10 is a schematic diagram illustrating a planar shape of a second electrode layer provided on a substrate of FIG. 1 and a wiring pattern therearound.

The second electrode layers 16 in the respective organic light-emission elements 10 adjacent to each other are, as described above, separated from each other by the element separating insulating layer 24 of the gap region VZ in the X-axis direction, while connected in the Y-axis direction. Therefore, its planar shape is a rectangle whose longitudinal direction is the Y direction as illustrated in FIG. 10. FIG. 10 is a schematic diagram illustrating a planar shape of the second electrode layer 16 provided on the board 111 and a wiring pattern thereabout. As illustrated in FIG. 10, in this display device, the second electrode layers 16 each extend in the Y direction to pass through the display region 110, and are aligned in the X-axis direction. Further, both ends of each of the second electrode layers 16 are connected to a common wiring pattern, and connected to the common power supply line GND (see FIG. 2) via pads P1 and P2.

The metal layer 17 is formed on the surface of the pixel-driving-circuit forming layer 112 like the first electrode layer 13, and functions as an auxiliary wire compensating for a voltage drop in the second electrode layer 16 serving as a main electrode. The metal layer 17 is in contact with the second electrode layer 16 in the opening 24K2, and forms the connection section 21 connected electrically to the second electrode layer 16 (see FIG. 3 and FIG. 5).

In a case where this metal layer 17 is not present, the electric potential of the second electrode layer 16 connected to the common power supply line GND (see FIG. 2) is not constant among the organic light-emission elements 10R, 10G, and 10B, due to a voltage drop according to a distance from a power source (not illustrated) to each of the organic light-emission elements 10R, 10G, and 10B, and thereby remarkable variations easily occur. Such variations in the electric potential of the second electrode layer 16 cause luminance unevenness of the display region 110 and thus are not desirable. The metal layer 17 functions to suppress a voltage drop from the power source to the second electrode layer 16 to a minimum, and prevent the occurrence of such luminance unevenness, even when a screen is enlarged in the display region 110. It is to be noted that in Japanese Unexamined Patent Application Publication No. 2010-44894 mentioned above, cathodes 34c in the respective organic light-emission elements emitting light of the same color also are separated from each other. In contrast, in the present embodiment, the organic light-emission elements 10 emitting light of the same color are connected and thus, a voltage drop does not easily occur. For this reason, the present embodiment is more suitable for an increase in the screen of the display region 110.

This display device may be produced as follows, for example.

First, on the board 111 made of the above-described material, the pixel driving circuit 150 including the drive transistor Tr1 and the write transistor Tr2 is formed. Specifically, at first, a metal film is formed on the board 111 by, for example, sputtering. Subsequently, the metal film is patterned by, for example, a photolithography method, dry etching, or wet etching, and therefore the metal layers 211G and 221G and a part of the signal line 120A are formed on the board 111. Next, the entire surface is covered by a gate insulating film. Further, a channel layer, a channel protective film, a drain electrode as well as a source electrode, and the metal layers 216D and 226D as well as the metal layers 216S and 226S are formed on the gate insulating film sequentially, to be in a predetermined shape. Here, a part of the signal line 120A, the scanning line 130A, and the power supply line 140A are each formed as a second metal layer, when the metal layers 216D and 226D as well as the metal layers 216S and 226S are formed. At the time, a connection section connecting the metal layer 221G and the scanning line 130A, a connection section connecting the metal layer 226D and the signal line 120A, a connection section connecting the metal layer 226S and the metal layer 211G are formed beforehand. Subsequently, the whole is covered with the protective film, which completes the pixel driving circuit 150. At the time, at a predetermined position in the protective film on the metal layer 216S, an opening is formed by dry etching or the like.

After the pixel driving circuit 150 is formed, for example, a photosensitive resin having polyimide as a main component is applied to the entire surface by spin coating or the like. Subsequently, the photosensitive resin is subjected to a photolithography process, and thereby the flattening film having the connection hole 124 is formed. Specifically, the connection hole 124 communicating with an opening provided in a protective film is formed by, for example, selective exposure and development using a mask having an opening at a predetermined position. Subsequently, the flattening film may be burned optionally. As a result, the pixel-driving-circuit forming layer 112 is obtained.

Further, the first electrode layer 13 made of the above-described predetermined material and the metal layer 17 are formed. Specifically, after a metal film made of the above-mentioned material is formed over the entire surface by, for example, sputtering, a resist pattern (not illustrated) in a predetermined shape is formed on the laminated film by using a predetermined mask. Furthermore, using the resist pattern as a mask, selective etching of the metal film is performed. At the time, the first electrode layer 13 is formed to cover the surface of the flattening film and fill the connection hole 124. Moreover, the metal layer 17 is formed on the surface of the flattening film so as to surround the first electrode layer 13 and not to overlap the signal line 120A. It is desirable that the metal layer 17 be formed by using the same type of material as that of the first electrode layer 13, together with the first electrode layer 13 at a time.

Figure 11A:
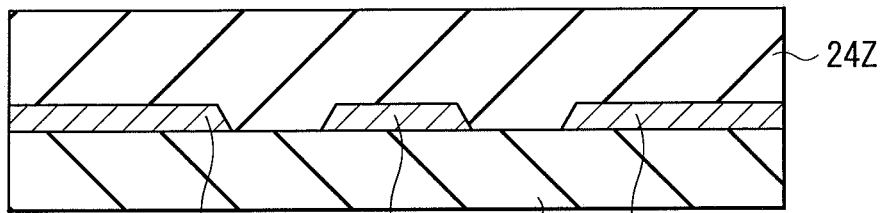
FIGS. 11A to 11D are cross-sectional diagrams illustrating one process in a method of producing the display device illustrated in FIG. 1.
Figure 11B:
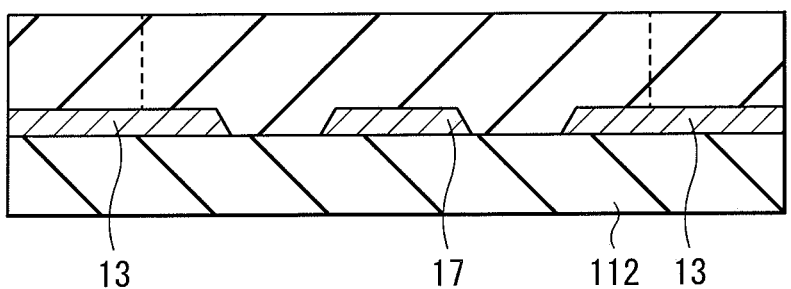
Figure 11C:
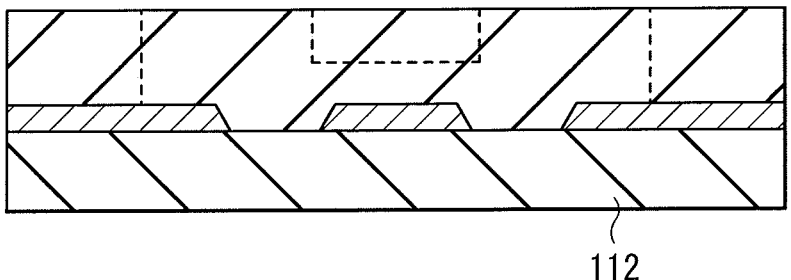
Figure 11D:
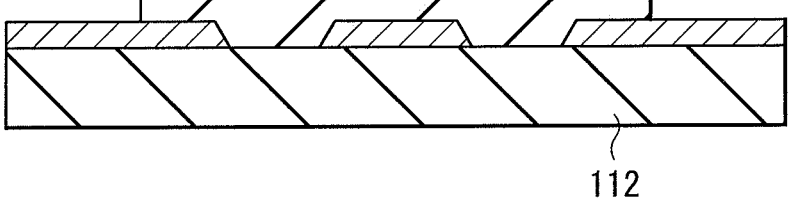

Subsequently, a gap between the first electrode layers 13 adjacent to each other is filled, and the element separating insulating layer 24 is formed to cover the metal layer 17. At the time, the openings 24K1 and 24K2 are formed at predetermined positions, and the concave section 24G extending in the Y direction is formed in the gap region VZ. The concave section 24G is formed by, for example, performing multiple exposure processing. Specifically, first, as illustrated in FIG. 11A, an insulating film 24Z to become the element separating insulating layer 24 later is formed to cover the entire pixel-driving-circuit forming layer 112 provided with the first electrode layer 13 and the metal layer 17. Subsequently, as illustrated in FIG. 11B, a region R20 corresponding to the emission region 20 is exposed through use of a photomask M1. Here, of the insulating film 24Z, a part in the thickness direction is entirely exposed. Subsequently, as illustrated in FIG. 11C, a region R24G that is a part of the gap region VZ is exposed by using a photomask M2. At the time, only a part reaching a predetermined depth from the top surface of the insulating film 24Z is exposed by, for example, controlling exposure time. After that, the element separating insulating layer 24 including the concave section 24G as illustrated in FIG. 11D is obtained by performing a development process using a predetermined developer and thereby removing an exposed part. Alternatively, the concave section 24G may be formed by exposure processing using a half-tone mask. In this case, there is used a half-tone photomask provided with a first exposure section corresponding to the emission region 20 and a second exposure section corresponding to the concave section 24G. This makes it possible to transfer a first exposed pattern corresponding to the emission region 20 and a second exposed pattern corresponding to the concave section 24G to the insulating film that later becomes the element separating insulating layer, at one exposure. Here, the first exposure section allows exposure light to pass therethrough sufficiently, while the second exposure section functions to control transmittance of the exposure light. Controlling the transmittance in the second exposure section makes it possible to control the depth of the concave section 24G. According to such exposure processing using the half-tone mask, it is possible to improve productivity further.

Subsequently, the organic layer 14 is formed by sequentially laminating the hole injection layer 14A, the hole transport layer 14B, the luminous layer 14C, and the electron transport layer 14D made of the predetermined materials and having the predetermined thicknesses described above by, for example, vapor deposition, to completely cover the exposed part of the first electrode layer 13. Further, the second electrode layer 16 is formed to face the first electrode layer 13 to cover the organic layer 14 interposed therebetween and also cover the entire surface of the metal layer 17 in the connection section 21, and therefore the organic light-emission element 10 is completed. At the time, the organic layer 14 and the second electrode layer 16 are divided in the X-axis direction by the edges EG1 and EG2 of the concave section 24G.

Subsequently, the protective film 18 made of the material described above is formed to cover the whole. Finally, an adhesive layer is formed on the protective film 18, and the sealing substrate 19 is affixed across this adhesive layer interposed therebetween. As a result, the display device is completed.

In the display device obtained in this way, the scanning signal is supplied through the gate electrode (the metal layer 221G) of the write transistor Tr2 from the scanning-line driving circuit 130 to each pixel, and the image signal from the signal-line driving circuit 120 is retained at the retention capacitor Cs via the write transistor Tr2. On the other hand, the power-supply-line driving circuit 140 supplies the first electric potential higher than the second electric potential to each of the power supply lines 140A in synchronization with the scanning performed on a line-by-line basis by the scanning-line driving circuit 130. As a result, the conduction state of the drive transistor Tr1 is selected, and a driving current Id is injected into each of the organic light-emission elements 10R, 10G, and 10B, and thereby recombination between positive hole and electron occurs, causing emission of light. Multipath reflection of this light occurs between the first electrode layer 13 and the second electrode layer 16, and this light is extracted after passing through the second electrode layer 16, the protective film 18, and the sealing substrate 19.

As described above, in the present embodiment, the organic layers 14 adjacent to each other and the second electrode layers 16 adjacent to each other in the X-axis direction are separated from each other by the concave section 24G of the element separating insulating layer 24 in the gap region VZ. For this reason, it is possible to reliably prevent occurrence of a short circuit between the first electrode layer 13 and the second electrode layer 16 and a short circuit between the first electrode layers 13 adjacent to each other, even when an overlap between the organic layers 14 occurs as a result of narrowing a mutual distance between the organic light-emission elements 10 of different colors. In other words, it is possible to control driving of each of the organic light-emission elements 10 sufficiently, while supporting the narrowing of the mutual distance between the organic light-emission elements 10. As a result, it is possible to exhibit high display performance such as excellence in uniformity of light-emission luminance distribution and color separability in the display region 110, while securing a high numerical aperture.

In addition, in the present embodiment, the second electrode layers 16 extending in the Y-axis direction and aligned in the X-axis direction are naturally formed by forming the concave section 24G in the element separating insulating layer 24 beforehand, and depositing the predetermined material to cover the entire display region 110. Therefore, the second electrode layers 16 reliably separated from each other may be readily arranged at appropriate positions, without using high-precision patterning.

Figure 12:
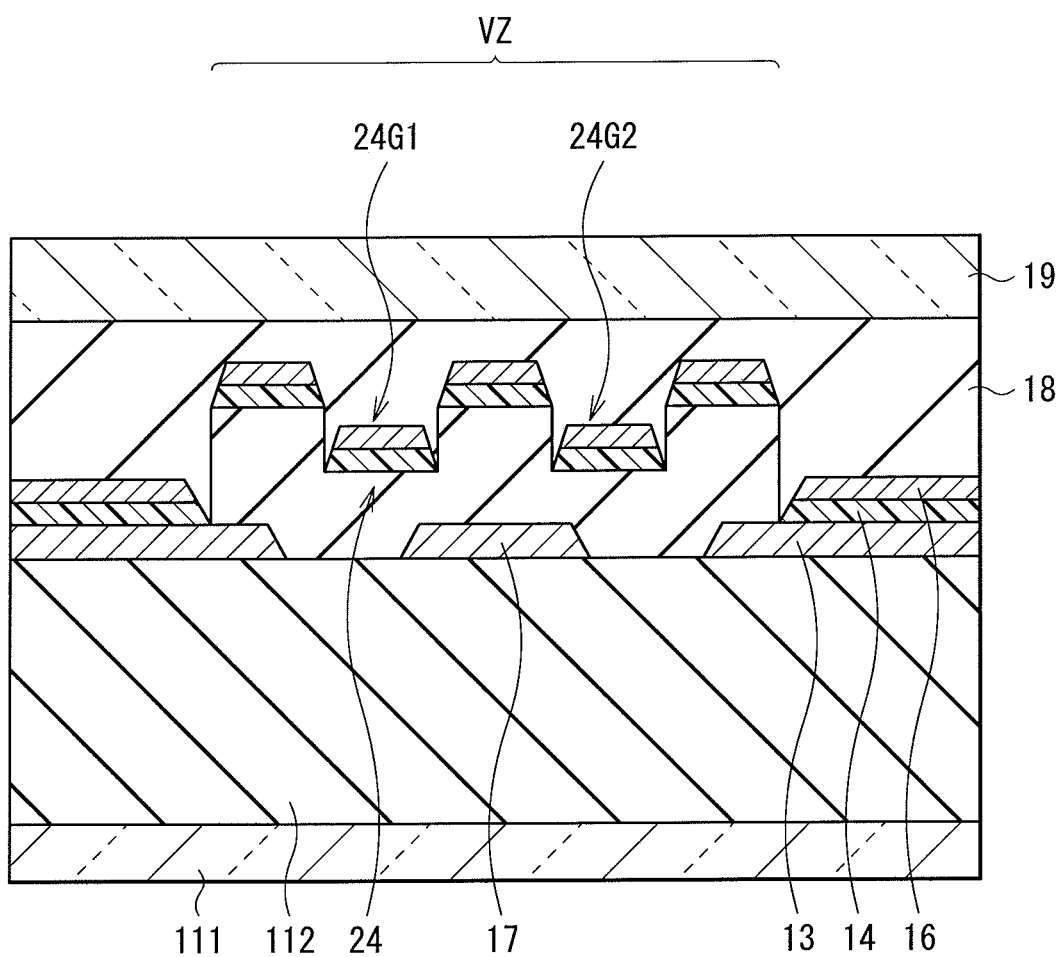
FIG. 12 is a cross-sectional diagram illustrating a configuration of a main part of a display device serving as a first modification.
Figure 13:
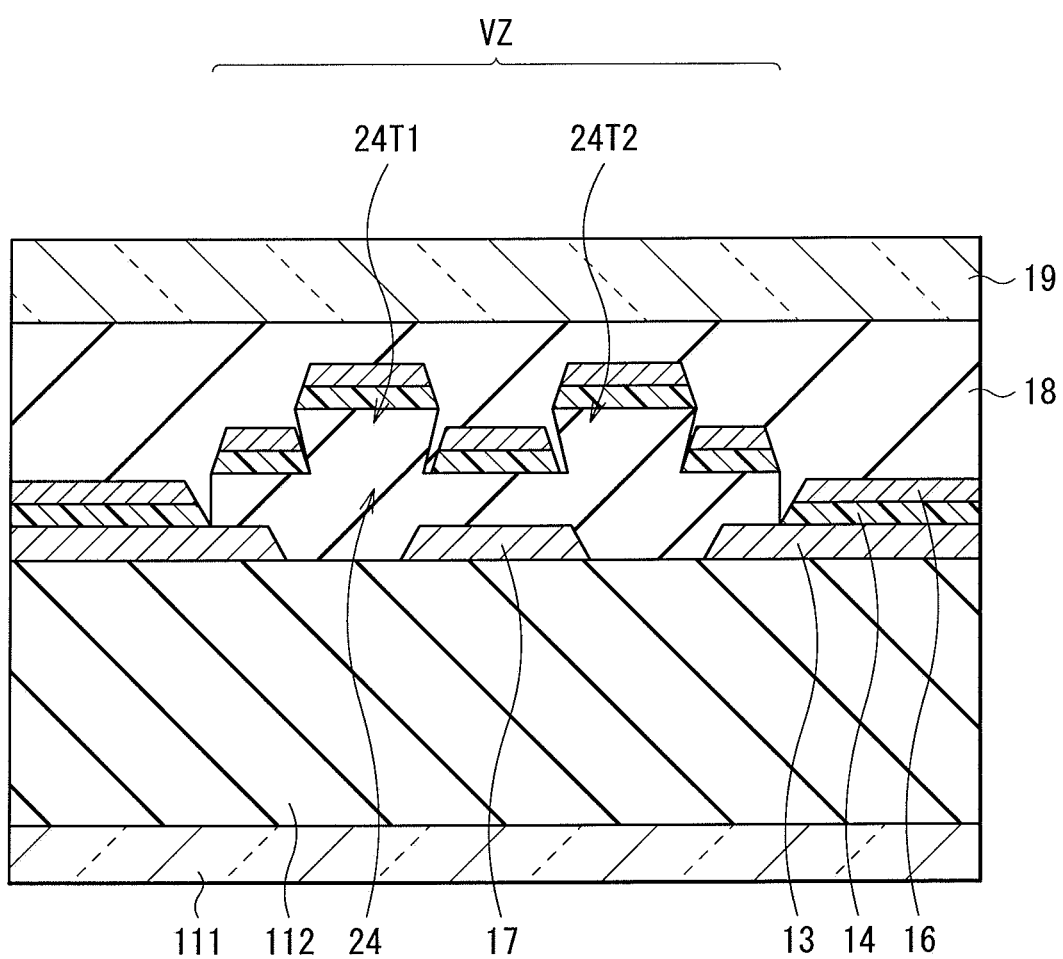
FIG. 13 is a cross-sectional diagram illustrating a configuration of a main part of a display device serving as a second modification.
Figure 14:
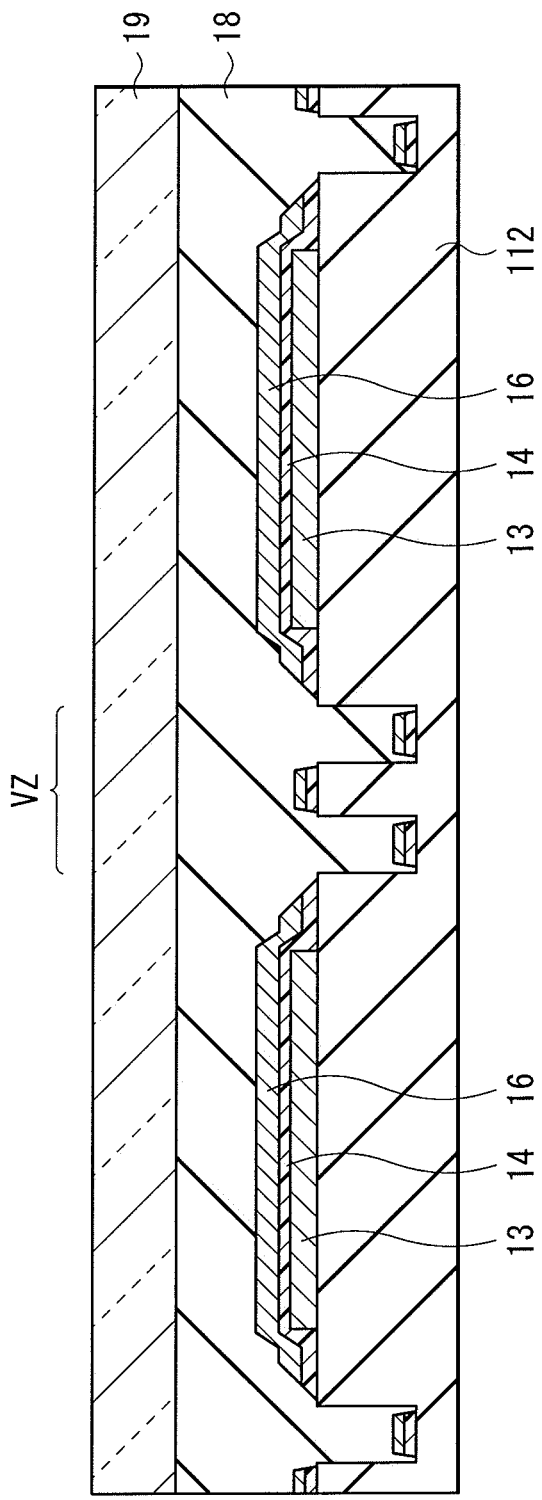
FIG. 14 is a cross-sectional diagram illustrating a configuration of a main part of a display device serving as a third modification.

Up to this point, the present technology has been described by using the embodiment, but is not limited to the embodiment, and may be variously modified. For example, in the embodiment described above, one concave section 24G is provided in the element separating insulating layer 24 and therefore the two pairs of steps are formed, but the present technology is not limited to this example. For instance, as in a first modification in FIG. 12, two concave sections 24G1 and 24G2 may be formed in the element separating insulating layer 24, and many pairs of steps may be formed. Further, as in a second modification in FIG. 13, one or more than one convex sections 24T (24T1 and 24T2) may be formed in an element separating insulating layer 24. Furthermore, as in a third modification illustrated in FIG. 14, element separation in the X-axis direction may be performed through formation of two or more pairs of steps by denting a flattening film, a protective film, and the like of a pixel-driving-circuit forming layer 112, without forming an element separating insulating layer 24. It is to be noted that FIG. 14 is a cross-sectional diagram corresponding to FIG. 4 in the above-described embodiment. In any of these cases, effects similar to those in the embodiment are obtained.

In addition, in the embodiment described above, the light-emission elements emitting light of the same color are aligned in the first direction (Y-axis direction), and the light-emission elements emitting light of different colors are aligned in the second direction (X-axis direction), but are not limited to this example. Light-emission elements emitting light of different colors may be aligned in both the first and second directions. Moreover, the first direction and the second direction are not limited to being intersecting each other at right angles, but may intersect each other at an angle other than 90 degrees.

Further, the present technology is not limited to the above-described material of each layer and the lamination order, or film formation method in the embodiment described above. For example, the embodiment has been described for the case where when the first electrode layer 13 is the anode and the second electrode layer 16 is the cathode, but the first electrode layer 13 may be a cathode and the second electrode layer 16 may be an anode. Furthermore, the embodiment has been described above by using the configurations of the organic light-emission elements 10R, 10G, and 10B specifically, but the layers may not be all provided, or other layers may be further provided. For example, a hole-injection thin-film layer made of chromium oxide (III) ($Cr_2O_3$), ITO (Indium Tin Oxide: an oxide mixed film of indium (In) and tin (Sn)), or the like may be provided between the first electrode layer 13 and the organic layer 14.

In addition, the embodiment has been described above for the case where the second electrode layer 16 is configured by using a semi-transmissive reflective layer, but the second electrode layer 16 may have a structure in which a semi-transmissive reflective layer and a transparent electrode are laminated sequentially from the first electrode layer 13 side. This transparent electrode is intended to lower the electrical resistance of the semi-transmissive reflective layer, and is made of a conductive material being sufficiently translucent with respect to light produced in a luminous layer. As a material forming the transparent electrode, for example, a compound including ITO or indium, zinc (Zn), and oxygen is preferable. This is because use of this material makes it possible to obtain high conductivity, even if the film is formed at room temperature. The thickness of the transparent electrode may be, for example, 30 nm or more and 1,000 nm or less. In this case, there may formed a resonator structure in which the semi-transmissive reflective layer is provided as one end, the other end is provided at a position opposite to the semi-transmissive electrode across the transparent electrode interposed in between, and the transparent electrode serves as a resonance section. Moreover, when such a resonator structure is provided, the organic light-emission elements 10R, 10G, and 10B may be covered with the protective film 18, and this protective film 18 may be made of a material having a refractive index in about the same level as that of the material forming the transparent electrode, which makes it possible to allow the protective film 18 to serve as a part of the resonance section and thus is desirable.

In addition, each of the embodiment and the like has been described above for the case of the active matrix display device, but the present technology is also applicable to a passive matrix display device. Further, the configuration of the pixel driving circuit for active matrix driving is not limited to each of the embodiment and the like described above, and a capacitive element or a transistor may be added optionally. In this case, according to a change in the pixel driving circuit, a desirable driving circuit may be added, other than the signal-line driving circuit 120 and the scanning-line driving circuit 130 described above.

The present disclosure contains subject matter related to that disclosed in Japanese Priority Patent Application JP 2010-182470 filed in the Japan Patent Office on Aug. 17, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   a substrate;
   a plurality of scanning lines extending along a first direction and disposed on the substrate;
   a plurality of signal lines extending along a second direction that is perpendicular to the first direction and disposed on the substrate;
   a plurality of pixel circuits disposed on the substrate;
   a planarization film that covers the plurality of scanning lines, the plurality of signal lines and the plurality of pixel circuits;
   a plurality of light emitting elements formed on the planarization film, wherein each of the plurality of light emitting elements comprises:
      a first electrode disposed on the planarization film;
      an organic layer disposed on the first electrode, and
      a second electrode disposed on the organic layer;
   wherein a gap region is located between a first light emitting element and a second light emitting element of the plurality of light emitting elements adjacent to each other in a planar view,
   wherein the gap region comprises a recess region, a first portion and a second portion, the recess region being located between the first portion and the second portion, the first portion and the second portion being formed on the planarization film,
   wherein the first portion and the second portion comprise a same organic material,
   wherein a thickness from a top surface of the first electrode to a top surface of the first portion is greater than a total thickness of the organic layer and the second electrode, and
   wherein a thickness from the top surface of the first electrode to a top surface of the second portion is greater than a total thickness of the organic layer and the second electrode.

2. The display device according to claim 1, wherein the organic layer is separated from each of the first electrode, the first portion, the second portion and the recess region in the first direction.

3. The display device according to claim 1, wherein the organic layer is disposed on the first portion, the second portion and the recess region.

4. The display device according to claim 1, wherein the gap region separates adjacent light emitting elements of the plurality of light emitting elements.

5. The display device according to claim 1, wherein the recess region is made of the same organic material.

6. The display device according to claim 1, further comprising a metal film formed on the planarization film, the metal film being electrically connected to the second electrode of at least one of the plurality of light emitting elements in a location spatially separated from the plurality of light emitting elements.

7. The display device of claim 6, wherein the metal film is configured to function as an auxiliary wire compensating for a voltage drop in the second electrode.

* * * * *